United States Patent [19]

Baldwin

[11] 3,867,650

[45] Feb. 18, 1975

[54] COMPOUND TRANSISTOR CONNECTION LOADING FOR A CURRENT

[75] Inventor: Gary Lee Baldwin, Wall Twp., Monmouth Co., N.J.

[73] Assignee: Bell Telephone Laboratories Inc., Murray Hill, N.J.

[22] Filed: Dec. 3, 1973

[21] Appl. No.: 421,027

[52] U.S. Cl. ............... 307/235, 307/315, 330/30 D, 332/11 D, 332/9 T

[51] Int. Cl. ... H03k 5/20, H03k 13/22, H03k 17/62

[58] Field of Search ....... 332/9 T, 16 T, 31 T, 11 D; 307/315, 243, 235 R; 330/22, 30 D, 69

[56] References Cited

UNITED STATES PATENTS

| | | | |
|---|---|---|---|
| 3,219,911 | 11/1965 | Burfeindt | 307/315 X |
| 3,274,446 | 9/1966 | Nagata | 307/315 X |
| 3,743,764 | 7/1973 | Wittmann | 330/30 D |
| 3,783,307 | 1/1974 | Breuer | 330/30 D |

*Primary Examiner*—Alfred L. Brody

*Attorney, Agent, or Firm*—C. S. Phelan

[57] ABSTRACT

A differential amplifier type of current switch includes in series in the two current paths thereof the first and last stages, respectively, of a common collector type of compound transistor. Arrangements are shown for employing current switches of this type for controlling, a charge parceling bipolar, feedback integrator of a delta modulator.

10 Claims, 2 Drawing Figures

COMPOUND TRANSISTOR CONNECTION LOADING FOR A CURRENT

BACKGROUND OF THE INVENTION

1. Field of the Invention

This invention relates to current switching gates and it relates, in particular, to differential amplifier types of such gates.

2. Description of the Prior Art

Electric signal pulses produced by logic gates often have an amplitude component representing variations in power supply voltage. Such variations can be avoided by applying strong regulation to the power supply. However, that sort of measure is costly if power supplies are provided on a per-gate basis. If a single supply is shared among many gates, some must be relatively remote from the supply; and then noise and switching transients on the connecting leads cause non-uniform gated pulse amplitudes. Delta modulation coders see such noise and transients as an enlarged step size which in turn means a loss of delta modulation coder resolving power.

SUMMARY OF THE INVENTION

The foregoing problem of dealing with pulse amplitude is relieved in accordance with an illustrative embodiment of the present invention in which plural amplifiers of a compound transistor are coupled between the current paths of a pulse gate employing two such paths.

It is one feature of the invention that the amplifiers are so biased that the amplitude difference between pulse binary coded levels is determined primarily as a function of the number of amplifiers in the compound transistor connection.

BRIEF DESCRIPTION OF THE DRAWING

A more complete understanding of the invention and various features, objects, and advantages thereof may be obtained from a consideration of the following detailed description and the appended claims in conjunction with the attached drawing in which:

DETAILED DESCRIPTION

Figure 1:
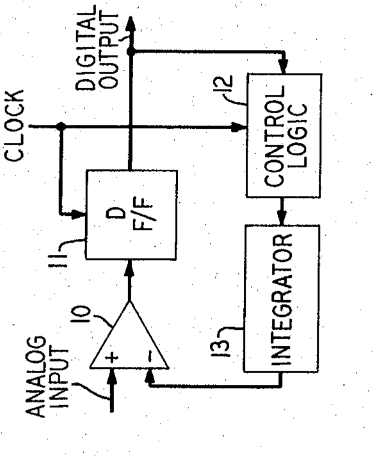
FIG. 1 is a simplified block and line diagram of a delta modulator using the present invention.

In FIG. 1 an analog input signal is applied to a noninverting input connection of an analog signal comparator 10, and the output of that comparator is coupled for controlling a D flip-flop circuit 11. The comparator and flip-flop circuit are advantageously combined to time share the output of a power supply (not separately shown) in the manner accomplished, for example, in the dual latch MC10130 described at pages 3–79 through 3–82 of the *MECI Integrated Circuits Data Book*, 3rd Edition, Sept. 1973, published by Motorola, Inc. The flip-flop is clocked by pulses from a source (not shown) operating at the delta modulator sampling rate, and the flip-flop output provides the delta modulator digital output. That same digital output and the clock signals are applied to a control logic circuit 12 which provides appropriate impedance matching and pulse amplitude regulation for coupling the digital output to control a charge parceling integrator 13. Both the control logic and the integrator will be hereinafter described in greater detail.

Output from the integrator is fed back to the inverting input of the comparator 10, to be compared against the incoming analog signal. When that signal is larger than the analog feedback, which is representative of the amplitude of the immediately preceding input signal sample, the flip-flop circuit 11 is reset. Similarily, the flip-flop circuit is set if the input analog signal is smaller than the feedback signal.

Figure 2:
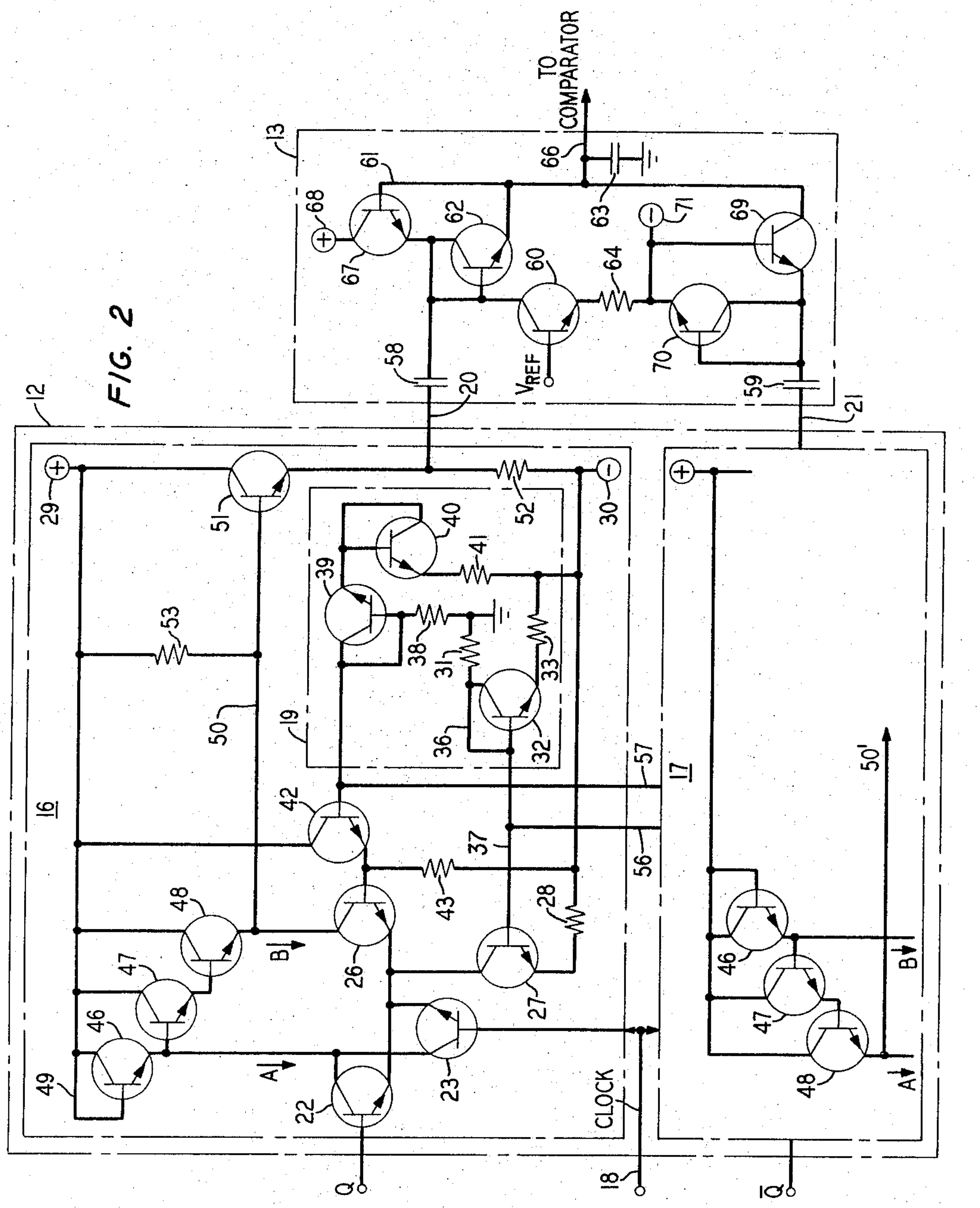
FIG. 2 is a schematic diagram of control logic and a controlled integrator used in the delta modulator of FIG. 1.

FIG. 2 illustrates schematic details of one embodiment for the control logic 12 and the integrator 13. All transistors used are advantageously of the n-p-n conductivity type. In this figure the Q and $\overline{Q}$ double-rail logic outputs of the D flip-flop circuit 11 are applied to a pair of current switch gates 16 and 17, respectively, in the control logic 12. In addition, the clock signals are supplied on a lead 18 which is connected to both of those current switch gates 16 and 17. The control logic 12 acts as an impedance matching arrangement to present a low output impedance to the integrator 13. In addition, the control logic assures a digital response, i.e., it assures that the signals coupled to the integrator will effect a digital response without significant influence of power supply variables.

Current switch gates 16 and 17 share a power supply and a bias and reference network 19, which network is in FIG. 2 included within the schematic diagram of the current switch gate 16. Otherwise the gates 16 and 17 are essentially the same except for a modified connection of a loading circuit to be described. Thus, only one of the gates is shown in full detail. This is the gate 16 which couples the delta modulation step-down signal, a negative-going reset signal, from the Q input lead to a lead 20 which couples control logic 12 to integrator 13. Similarly, gate 17 couples the step-up delta modulation signal, a negative-going set signal, from the $\overline{Q}$ input lead to a lead 21 which couples the gate 17 to integrator 13.

In the current switch gate 16, four transistors 22, 23, 26, and 27 comprise an emitter coupled logic gate. This circuit, which is in the differential amplifier format, includes two current paths A and B, each of which must be used to the exclusion of the other at any given steady state signal time. Transistors 22 and 23 comprise a coincidence gate to block conduction in the current path A in response to the coincidence of a negative-going delta modulation signal on the Q lead at the base of transistor 22, and a negative-going clock pulse which is coupled from the lead 18 to the base electrode of transistor 23. Such a coincidence condition forces all differential amplifier current into the B path which flows through transistor 26. That transistor operates in the active, i.e., unsaturated, conduction condition for extending a current path to the common emitter current path of the gate. The latter path includes the transistor 27 and a current limiting resistor 28. Similarly, if either the Q input or the clock input is in its relatively positive signal state, the corresponding one of transistors 22 and 23 is enabled for active conduction, and current flow is transferred from the B current path to the A current path by virtue of the well-known biasing effect in the common emitter current path.

Bias and reference network 19 supplies both of the current switches 16 and 17 and operates in conjunction with a positive voltage source 29 and a negative voltage source 30. Those sources also supply the differential amplifier and are schematically represented by circled polarity signs connected to the circuit point at which a terminal of corresponding polarity of a direct current supply is connected to the current switch gate circuit. The terminal of opposite polarity in each case is connected to ground. Similar schematic notation is utilized throughout the drawing. In the network 19, a resistor 31, the collector-emitter path of an n-p-n transistor 32, and a resistor 33 are connected in series between ground and the negative source 30. Transistor 32 is provided with a lead 36 between its base and collector electrodes to cause the transistor to operate as a diode. The same base electrode is also coupled by a lead 37 to the base electrode of the transistor 27 to establish the necessary bias voltage at the latter electrode to cause that transistor to operate as a current source. Similarly, a resistor 38, two diode-connected transistors 39 and 40, and resistor 41 are connected between ground and the negative source 30 to form a potential divider which fixes at the collector electrode of transistor 39 a predetermined reference potential. That potential is applied to the base electrode of a transistor 42 which has its collector-emitter conduction path connected in series with an emitter circuit resistor 43 between sources 29 and 30. This connection operates as an emitter-follower for supplying the reference voltage from the network 19 to the base electrode of transistor 26 in the current switch.

The bias voltage at the base electrode of transistor 27 is set at a level to establish sufficient conduction through transistor 27 to maintain either the transistor 26 or both of the transistors 22 and 23 in active conduction at all times. On the other hand, the bias voltage supplied at the base electrode of transistor 26 is set so that, given the aforementioned current level set by transistor 27, transistor 26 will be maintained in active conduction unless at least one of the transistors 22 and 23 is biased for active conduction.

The collector circuits of transistors 22, 23, and 26 are included in the A and B current paths of the current switch gate 16, and they receive current from the positive source 29 by way of a type of compound transistor connection. Such connections are taught, for example, in the U.S. Pat. No. 2,663,806 of S. Darlington. Thus, a circuit of this type is sometimes called simply a "Darlington circuit" or a "Darlington compound transistor." The particular compound connection which is advantageously employed in the illustrative embodiment includes three transistors 46, 47, and 48, all of the same conductivity type, and connected in a cascade amplifier sequence in the compound connection. The common, collector connection of all of the three transistors is directly connected to the positive source 29. The base connection of the compound transistor is at the base electrode of transistor 46; and that electrode is connected by a lead 49 to the collector electrode of the same transistor so that the input stage in the cascade sequence of the compound transistor is diodeconnected. Two emitter connections are utilized in the illustrated compound connection, one at the emitter electrode of the input stage transistor 46 (in switch path A) and the other at the emitter electrode of the cascade output transistor 48 (in switch path B). Each stage of the compound connection also has its emitter electrode connected to the base electrode of any following stage in the cascade sequence.

The current switch gate output is in switch gate 16 derived from the current path B, i.e., the path at the emitter electrode, of the output stage transistor 48 in the compound connection. This output is derived by a lead 50 that is connected from the emitter electrode of transistor 48 to the base electrode of an emitter-follower connected transistor 51. That transistor is connected in series with its emitter circuit resistor 52 between the positive source 29 and the negative source 30. A bias resistor 53 connects source 29 to the base electrode of transistor 51, and has a resistance which is chosen to limit current flow from the source 29 to the base electrode of transistor 51 to a level which allows the transistor to conduct at different current levels in response to conduction in one or the other of the switch paths A and B, respectively. However, the resistance of resistor 53 must also be small enough so that the resistor develops insufficient potential difference to draw the compound transistor output stage transistor 48 into conduction when the switch path A, in gate 16, is conducting and the path B is not conducting. The aforementioned output lead 20 is connected to the emitter electrode of transistor 51.

When current flows in the path A in response to conduction in either of the transistors 22 or 23, the diode-connected transistor 46 in the compound transistor conducts the full bias current permitted by transistor 27. Transistors 47 and 48 are held in a nonconducting condition because the aforementioned low voltage drop across resistor 53 keeps the emitter of transistor 48 at a relatively high voltage. Consequently, the emitter electrode of transistor 51 conducts at its high conduction level and thereby produces on lead 20 an output voltage which is equal to the terminal voltage V29 with respect to ground of the source 29, less the base-emitter junction voltage drop $V_{BE}$ of the transistor 51. However, when current flows in the path B rather than the path A of the current switch, all of the transistors 46, 47, and 48 conduct in an active condition to supply the collector electrode of transistor 26 with current. Consequently, the voltage level at the latter collector electrode is fixed by the junction voltage drops of the base-emitter junctions of transistors 46 through 48. This causes the base connection voltage of transistor 51 to be at a lower level than that which previously prevailed as determined by only resistor 53. Consequently, the output voltage on lead 20 is now a function of the source voltage $V_{29}$, less the four base-emitter junction voltage drops of transistors 46 through 48, and 51. The difference between the two possible voltage levels on the output lead 20 is simply a voltage magnitude of three transistor base-emitter junction voltage drops since the source voltage disappears from the difference. That difference is coupled by alternating current impedances into the integrator 13 so that the operation of the latter is a function of a voltage magnitude determined primarily by a certain number of transistor junction voltage drops and is relatively independent of power supply variables.

The step-up switch gate 17 in the control logic 12 operates in a manner which is similar to that just described for the step-down switch gate 16. However, the step-up switch responds to the Q portion of the delta modulator digital output signal. This operation is in an oppositely directed sense of the current switch gate output voltage differences because the compound transistor is oppositely connected with respect to the current paths A and B in the switch gate 17. The output lead 50' is in this case retained at the emitter electrode of the output stage transistor 48 in the compound transistor connection. Consequently, lead 50' is coupled to current path A in the step-up gate 17. Otherwise, the connections of the step-up gate 17 are the same as those of the step-down gate 16; and clock signals are supplied in the same way to a transistor 23 in the A current path, while bias and reference voltages are supplied by way of leads 56 and 57 to base electrodes of transistors 27 and 42 in the step-up switch gate 17 from the bias and reference network 19. Consequently, the output of the switch gate 17 provided to the integrator 13 on lead 21 is, when the clock signal is in its low signal state, of the same configuration and phase as that provided by the switch gate 16 on the lead 20.

When the clock signal on lead 18 is in its low voltage state, the current switch gate which is connected to the one of the two inputs Q or $\bar{Q}$ that is at the same time in the low voltage state produces current flow in the B current path of that gate and in the A current path of the other switch gate. If the Q input is assumed at that time to be low, the output of switch gate 16 on lead 20 is low, and the corresponding output on lead 21 for switch gate 17 is also low. Opposite states of Q and $\bar{Q}$, during a low-clock signal, cause both outputs on leads 20 and 21 to be high. However, when the clock signal is in its high signal state, current flows in the A path of both switch gates and thereby produces a high signal state for the step-down gate 16 output lead 20 and a low signal state on the output lead 21 of switch gate 17. The latter high-clock conditions prevail regardless of the states of Q and $\bar{Q}$.

Integrator 13 receives the double-rail logic input signals from control logic 12 by way of leads 20 and 21 and coupling capacitors 58 and 59 which are connected in series in those two leads respectively. Integrator 13 is a charge parceling integrator of the type described in an article entitled "Delta Modulation Codec for Telephone Transmission and Switching Applications," by R. R. Laane and B. T. Murphy, appearing in the July-August 1970 *Bell System Technical Journal*, at pages 1,013 through 1,031. In particular, the integrator 13 is similar to that shown on page 1019 of the Laane, et al., article but adds a combined pull-down transistor 60 and emitter resistor 64 while omitting a step compensation circuit that would otherwise be connected in series in a lead 61. Transistor 60 is biased by a source $V_{ref}$ to conduct a relatively small amount of leakage current through its emitter resistor 64 so that transistor 67 always conducts in the quiescent mode, i.e., when the clock signal on lead 18 is high. This provides for the proper recharging of capacitor 58 in anticipation of subsequently arriving charging pulses, and it maintains proper bias on transistor 62 even though a succession of input pulses of one polarity may be received. Otherwise, the integrator 13 need be described only briefly. This integrator exhibits a step size which is independent of frequency over a wide range of the frequency spectrum; and it is, therefore, useful in delta modulators.

A positive-going input signal on the lead 20 to integrator 13 is coupled through capacitor 58 to bias a diode-connected transistor 62 for conduction so that the input signal can charge the capacitor 58 and an integrator capacitor 63 in series. The internal collector emitter current path of transistor 62 is connected in series between the capacitors 58 and 63, and its emitter electrode is connected to an output lead 66 which extends to the inverting input connection of the comparator 10 in FIG. 1. When the input signal on lead 20 has attained its peak positive-going excursion and starts to return to its original lower signal level, the transistor 62 is thereby switched to a nonconducting condition to hold the charge on capacitor 63. However, the same action draws the further transistor 67 into heavier conduction by virtue of the resulting voltage difference across its base emitter junction which is connected between capacitor 63 and the collector electrode of transistor 62. Current flow from a positive voltage source 68 through transistor 67 discharges capacitor 58 through the output resistor 52 of switch gate 16 and the negative potential source 30 in that same gate.

In a similar manner, a negative-going signal excursion on the output lead 21 of switch gate 17 turns on a transistor 69 to discharge capacitors 63 and 59 in series from ground through the output impedance of switch gate 17. Upon the attainment of the negative-going peak excursion and the subsequent return of the lead 21 signal toward its higher voltage level, transistor 69 is switched to a nonconducting condition; and coupling capacitor 59 is restored to its normal charge state by current flow through the output impedance of switch gate 17, a diode-connected transistor 70, and a negative potential source 71.

In one operative embodiment of the circuits in FIG. 2, circuit elements employed were as follows:

| All Transistors | RCA type CA3018 n-p-n transistors |
|---|---|
| R28 | 276 ohms |
| R31 | 3,600 ohms |
| R33 | 800 ohms |
| R38 | 700 ohms |
| R41 | 2,900 ohms |
| R43 | 8,000 ohms |
| R52 | 7,400 ohms |
| R53 | 1,000 ohms |
| R64 | 10,000 ohms |
| C58 | 30 picofarads |
| C59 | 30 picofarads |
| C63 | 8,000 picofarads |

This circuit operated satisfactorily in a delta modulator having a 15 megacycle sampling rate and power supply voltage variations of ±20 percent.

It is shown in the aforementioned Laane, et al., article that a step voltage change on the capacitor 63 is a function of the capacitance thereof and of the capacitance of one of the coupling capacitors 58 or 59 used to achieve that step, as well as the magnitude of the input voltage step to the integrator that is transferred to the capacitor 63. The latter step, however, has a magnitude which is a function of three base-emitter junction voltage drops in the illustrative embodiment as already described. An approximation of the expression derived by Laane, et al., for the step voltage δ on the capacitor 63 is $$\delta \cong (\Delta V - 2V_{BE})\ (C_c/C_c + C_{63}).$$

In that expression the $\Delta V$ is the step voltage size provided by one of the leads 20 or 21, $C_c$ is the capacitance of one of the coupling capacitors 58 or 59, and $C_{63}$ is the capacitance of the capacitor 63 connected between output lead 66 and ground. The term $2V_{BE}$ represents the two junction voltage drops of the one of the transistor pairs 62, 67 or 69, 70 which is utilized to apply the step voltage to the capacitor 63. However, since it was previously determined for the illustrative embodiment that $\Delta V$ is equal to $3V_{BE}$, the foregoing expression reduces to $$\delta \cong (V_{BE}C_c/C_c+C_{63}).$$

From this it can be seen that if a larger or smaller voltage step is desired for the capacitor 63, without appreciably effecting time constants of the integrator 13, the switch gates of the control logic 12 are designed to include either a larger or a smaller number of cascaded transistors in the compound transistor connection employed for loading the current paths A and B of the gates.

Although the present invention has been described in connection with a particular embodiment thereof, it is to be understood that additional embodiments, modifications, and applications thereof which will be obvious to those skilled in the art are included within the spirit and scope of the invention.

What is claimed is:

1. In combination a differential amplifier having first and second current paths, means for biasing said amplifier to be responsive to first and second input signal levels for routing amplifier current to one or the other of said first and second paths, respectively, a compound transistor connection including plural cascade-connected amplifier stages, said stages including a diode-connected transistor input stage, means for connecting said input stage in series in said first current path, means for connecting the final one of said cascaded stages in series in only said second current path, and means for deriving an output signal from one of said paths.

2. The combination in accordance with claim 1 in which said one path is said second path and said deriving means comprises a transistor emitter follower stage having an input base electrode thereof coupled to said second path, and a resistor connected between collector and base electrodes of said emitter-follower, and having a resistance selected to limit current so that said emitter-follower stage conducts at different current levels in response to conduction in said first and second paths, respectively, but said resistor develops insufficient potential difference to draw said final stage into conduction when said current flows in said first path.

3. The combination in accordance with claim 1 in which said deriving means includes a charge parceling integrator, and means for capacitively coupling said one path to an input of said integrator, and said compound transistor connection includes sufficient stages so that said integrator is activated in response to only one of said input signal levels.

4. The combination in accordance with claim 1 in which there are provided in addition a further differential amplifier and compound transistor connection interconnected with each other and with said biasing means as aforesaid for the first-mentioned differential amplifier and compound transistor connection, and said deriving means includes means for deriving outputs from said first path of one of said differential amplifiers and said second path of the other of said differential amplifiers.

5. The combination in accordance with claim 1 in which said deriving means comprises an output connection, a storage capacitor connected across said output connection, a coupling capacitor coupled at one terminal to said second path, a diode-connected transistor connected in series between said coupling capacitor and said storage capacitor to be biased for conduction between such capacitors in response to attainment of a predetermined voltage difference between said signal excursions in said second path and said storage capacitor, and means, responsive to a nonconducting condition in said diode-connected transistor for restoring charge on said coupling capacitor to a predetermined reference level.

6. In combination, first and second electric current paths, means, responsive to first and second input signal levels, for routing current exclusively to one or the other of said paths, a compound transistor having first and second terminals between which current can flow through said transistor, said transistor also having a third terminal, connected through said transistor, to receive current flow from said first and second terminals, means for connecting said first and second terminals in series with said first path, and means for connecting said first and third terminals in series with said second path.

7. The combination in accordance with claim 6 in which said transistor comprises a plurality of transistors of the same conductivity type and each having base, emitter, and collector electrodes, means for connecting all of said collector electrodes to said first terminal, means for connecting said transistors in a cascade sequence with each transistor having its emitter electrode connected to the base electrode of the transistor following it in said sequence, means for interconnecting base and collector electrodes of an input transistor in said sequence, and means for connecting emitter electrodes of said input transistor and of an output transistor of said sequence to said second and third terminals, respectively.

8. In combination, first and second electric current paths, means for routing current exclusively to one or the other of said paths, a compound transistor including at least input and output transistor elements, means for connecting a first part of said elements, including said input element, to conduct at least part of said current routed to each of said first and second paths, and means for connecting a second part of said elements, including said output element, to conduct said current routed to only said second path.

9. The combination in accordance with claim 8 in which, said compound transistor elements are plural transistors having their collectors connected together to a terminal through which said current is supplied to both of said paths, said first part connecting means includes means for connecting an emitter electrode of said input element transistor to said first path, and said second part connecting means includes means for connecting an emitter electrode of said output element transistor to said second path.

10. The combination in accordance with claim 9 in which, said compound transistor further includes means for connecting base-emitter junctions of said transistors in series so that the difference between voltages at said emitter electrode of said output transistor when current is routed to said first path and said second path, respectively, is a function of the numbers of said base-emitter junctions included in each current routing.

* * * * *